(12) United States Patent
Dubey

(10) Patent No.: US 7,385,862 B2
(45) Date of Patent: Jun. 10, 2008

(54) SHARED REDUNDANT MEMORY ARCHITECTURE AND MEMORY SYSTEM INCORPORATING SAME

(75) Inventor: Prashant Dubey, Ghaziabad (IN)

(73) Assignee: STMicroelectronics PVT. Ltd., Uttar Pradesh (IN)

( * ) Notice: Subject to any disclaimer, the term of this patent is extended or adjusted under 35 U.S.C. 154(b) by 8 days.

(21) Appl. No.: 11/460,071

(22) Filed: Jul. 26, 2006

(65) Prior Publication Data

US 2007/0036011 A1    Feb. 15, 2007

(30) Foreign Application Priority Data

Jul. 29, 2005   (IN)   ................... 2023/DEL/2005

(51) Int. Cl.
*G11C 7/00*    (2006.01)
(52) U.S. Cl. .................................... 365/200; 365/225.7
(58) Field of Classification Search ................ 365/200, 365/230.03, 230.02, 225.7
See application file for complete search history.

(56) References Cited

U.S. PATENT DOCUMENTS

| | | | |
|---|---|---|---|
| 5,742,556 A | | 4/1998 | Tavrow |
| 5,761,138 A | * | 6/1998 | Lee et al. .................... 365/200 |
| 5,793,683 A | | 8/1998 | Evans |
| 6,208,569 B1 | * | 3/2001 | Patel et al. .................. 365/200 |
| 6,414,896 B1 | * | 7/2002 | Kim et al. ............. 365/230.03 |
| 2002/0086449 A1 | | 7/2002 | Sohn et al. |
| 2002/0113251 A1 | * | 8/2002 | Brady ......................... 257/200 |
| 2003/0099132 A1 | | 5/2003 | Ooishi et al. |

OTHER PUBLICATIONS

EP 1 750 282 A1 European Search Report; Nov. 23, 2006.

* cited by examiner

*Primary Examiner*—Vu A Le
(74) *Attorney, Agent, or Firm*—Hogan & Hartson LLP

(57) ABSTRACT

A memory system incorporates shared redundant memories and has a shared redundant memory architecture. The memory system includes a modified memory to be used as a shared redundant memory between memory systems. These memory systems may have several smaller memories forming a single logical memory or various memories in close proximity on an integrated circuit system. The shared redundancy is achieved by adding a comparator to the redundant element for comparing between the faulty address and the system address and performing a memory operation based on the comparator output. As the redundant memory operations are performed in parallel to the memory structures, setup and hold times are reduced. Shared redundancy also results in reduced integrated circuit area.

12 Claims, 4 Drawing Sheets

FA = Faulty Address
FM = Faulty Memory
QRED = Data Output of Redundant Memory
NOTE : Muxes can also be outside the memory also.
NOTE : Generation of HIT signals will depend upon the Faulty Memory. HIT will not atall be generated for the memory which is not faulty.
NOTE : More than 1 faulty memory can be repaired with this scheme (not shown in fig.)

SHARED REDUNDANT MEMORY ARCHITECTURE AND MEMORY SYSTEM INCORPORATING SAME

RELATED APPLICATION

The present invention claims priority of India Patent Application No. 2023/Del/2005 filed Jul. 29, 2005, which is incorporated herein in its entirety by this reference.

FIELD OF THE INVENTION

The present invention discloses a shared redundant memory architecture and memory system incorporating the same. Further, it also describes two different memory systems incorporating the redundant memory.

BACKGROUND OF THE INVENTION

The increasing complexity of systems and semiconductor process is resulting in more defects in the System On Chip (SoC) design process. The yield of these SoCs is directly linked to the memories on the SoC as around 60-70% of the silicon area on the chip is covered by the memories. Different types of memories are used for various operations on chips, like storage, temporary calculations, synchronization, buffering etc. Due to such a large presence of memories on chip, the chip yield is directly linked to the memory yield and hence to the memory defect level. In the newer technologies the degree of defects in the memories have increased to a great extent due to shrinking dimensions. In this context neither controlled process nor design can help in improving the SoC's yield as shrinking gate lengths have resulted in newer processes where the defect levels have gone beyond the control of the process and design. The only method, which can still help in enhancing the yield of the SoC, is to repair the faulty cases by providing redundant parts.

Many different types of redundant elements have been introduced in the previous inventions to deal with this problem. There are several proposed schemes for repairing faulty memories as well. These include providing redundancy for row, column, word, bit, soft memory or another piece of memory, which can be classified into two types:
1. The type-1 redundancy includes all the techniques which implement the redundancy inside the memory itself. Spare row, spare bit slice, or spare column redundancy can be put into this category.
2. The type-2 redundancy includes of techniques which provide redundancy as an external element to the memory. Spare memory, spare soft memory etc. can be put in this category.

The problem with using the type-1 redundancy in memory system is that it results in modified timing characteristics (setup/hold/access/cycle). This type of redundancy also results in increased development cycle time for the memory compilers. For instance, it is observed that the column redundancy leads to increased repair time for the memory after power on. In the row redundancy, the setup and hold time of the memory are increased which puts a limit on the number of redundant rows allowed. The problem with the type-2 redundancy is seen in terms of the memory performance as the soft routed memories can be routed all round the SoC which results in unnecessary routing congestion. Also soft memories cannot be used for multi port memories as considerably more effort is required in designing multi-port soft memories. The timing characteristics (setup/hold/access) of the memory are modified by the soft memories as well. The area is another concern as soft memories are made using standard cells in a standard cell library which take more area than ASIC memories. This puts a restriction on the number of redundant elements allowed on an ASIC. Even in a case where a hard memory of same type is used instead of the soft memory, there is a significant area overhead as besides the storage elements other logic blocks in a memory like address decoders, I/O sections etc. are also duplicated.

At system level, memory redundancy results in another problem when there are several small memories on a chip. These small memories are either used to form a bigger memory or are used individually but in vicinity of each other on a chip. In such situations, the present techniques provide a redundant memory for each individual memory. But not all the memories fail on a wafer and it is observed that most of the time the redundant memories are wasted. Therefore putting redundancy for each memory is highly inefficient as it increases the overhead in terms of the memory area and fuse area and results in timing overhead as well. The redundant memories also impact the setup and hold times of the memories.

Hence there is need for a memory system with redundant memories that reduces the area overhead in terms of silicon and fuse area. There is also need for memory system with redundant memories that do not affect the timing characteristics of the memory. Collectively there is also need to provide a shared redundancy from the total bit size point of view for all memories present on a chip. The present invention provides a memory system incorporating shared redundant elements for the memories on any SoC or Application Specific Integrated Circuit (ASIC). The present invention also provides a shared redundant memory architecture. In this context when there are several small memories on a SoC, two different embodiments of a modified redundant memory are provided for use as a shared redundant element for different memory systems. The number and type of shared redundant memories on a SoC depends on the interconnect architecture and number of the small memories.

SUMMARY OF THE INVENTION

To obviate the drawbacks of the prior art the object of the instant invention is to provide memory system incorporating shared redundant memories and shared redundant memory architecture. A further object of the instant invention is to provide memory system to reduce area overhead for the fuse and redundant memory. Another object of the instant invention is to provide a memory system to eliminate the redundancy effects on the memory timing characteristics.

To achieve the aforesaid objects the instant invention provides a memory system including at least one memory structure, each said memory structure receiving at least one input address and corresponding set of inputs for performing an operation on said memory structure, a fuse box for storing and transmitting faulty address information of said memory structures, wherein there is at least one shared redundant memory, each of said shared redundant memory receiving said input addresses and said corresponding set of inputs for associated memories in a said memory structure and the faulty address information from the fuse box for repairing faulty locations in said associated memories; and at least one output selector, each said output selector for selecting between data output of said shared redundant memory and each data output of said associated memories responsive to a first control signal from said shared redundant memory.

Further, the instant invention also provides a shared redundant memory architecture including a comparator receiving a single input address and faulty address information for generating a first control signal for a memory system, a memory core receiving said first control signal for storing and retrieving data input for faulty address locations in repairable memories, an Input/Output (I/O) block for bidirectional data transmission in said memory core, and a first input selector receiving a data input and said enable input of said memory system for transmitting said data input to said I/O Block during write operation.

BRIEF DESCRIPTIONS OF THE DRAWINGS

The present invention will now be described with the help of accompanying drawings, in which.

DETAILED DESCRIPTION OF THE INVENTION

The current invention provides new high-speed memory system with modified redundant memories which are shared between various memories on a chip. Additionally, in the present invention, two different embodiments of shared redundant memory are provided for use depending on the memory systems on the chip. These memory systems can be categorized as follows:

1. Type-1 memory systems: In type-1 memory system, there are several small memories combined together to form a single large memory.
2. Type-2 memory systems: In type-2 memory system, there are several unrelated memories for different purposes located in close proximity of each other.

In both type-1 and type-2 systems, redundant memories are added to the system for purpose of repairing. The repair methodology/architecture is different from the existing techniques as the redundant memory is shared between various memories present on a SoC. However in order to henceforth differentiate normal memories from redundant memories, each of the memories (other than the redundant memories) in the memory systems will be referred to as repairable memories. Also, the redundant memory architecture is a little different for two different memory systems on the SoCs and henceforth these will be referred to as type-1 and type-2 redundant memories. Further, in both memory systems, it is assumed that the built-in self test (BIST) apparatus has tested all memory locations and programmed the Fault Address (FA) information in the fuse box.

Figure 1:
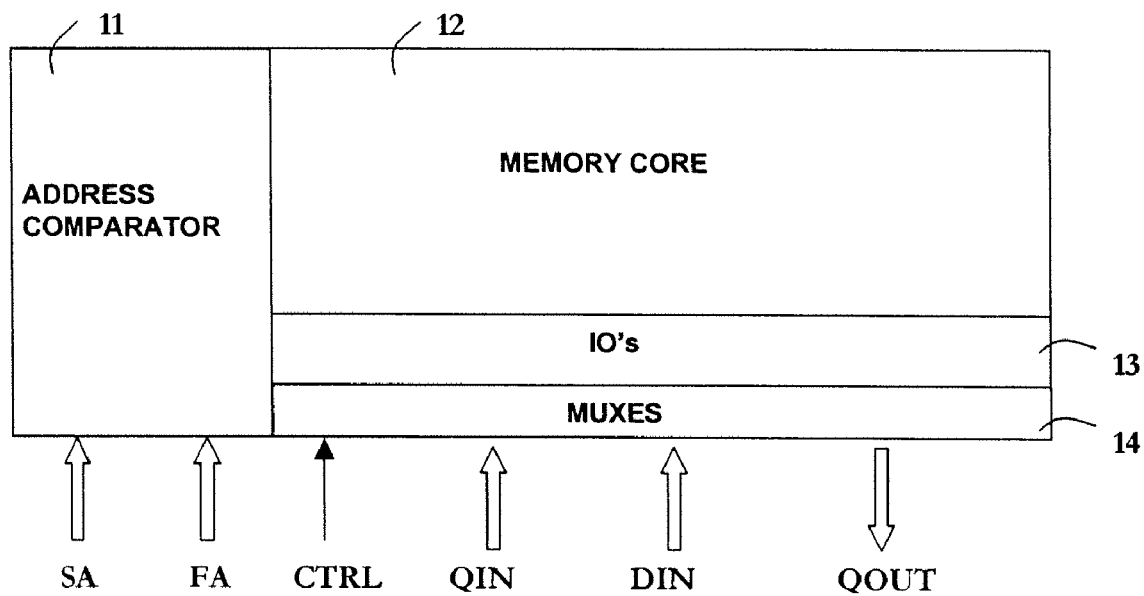
FIG. 1 illustrates the block diagram for the type-1 redundant memory architecture in accordance with the present invention.

The redundant memory architecture of the instant invention is similar to the conventional memory architecture except for the read or write operation mechanism. FIG. 1 illustrates the block diagram for the type-1 redundant memory. The redundant memory comprises a memory core 12, a set of multiplexers 14, Input/Output (I/O) section 13 and a comparator 11. The comparator 11 receives the FA from the fuse box and the System Address (SA) from the external pins. The output of the comparator 11 is coupled to the memory core 12 and the data output of the memory core 12 is coupled to the I/O section 13. A set of multiplexers 14 is added to the I/O section 13 of the redundant memory to select the repairable memory input as input to the redundant memory during a write operation. In another embodiment, a multiplexer may be added to the redundant memory architecture to select between the outputs of the redundant memory and the repairable memory for a read operation.

Figure 2:
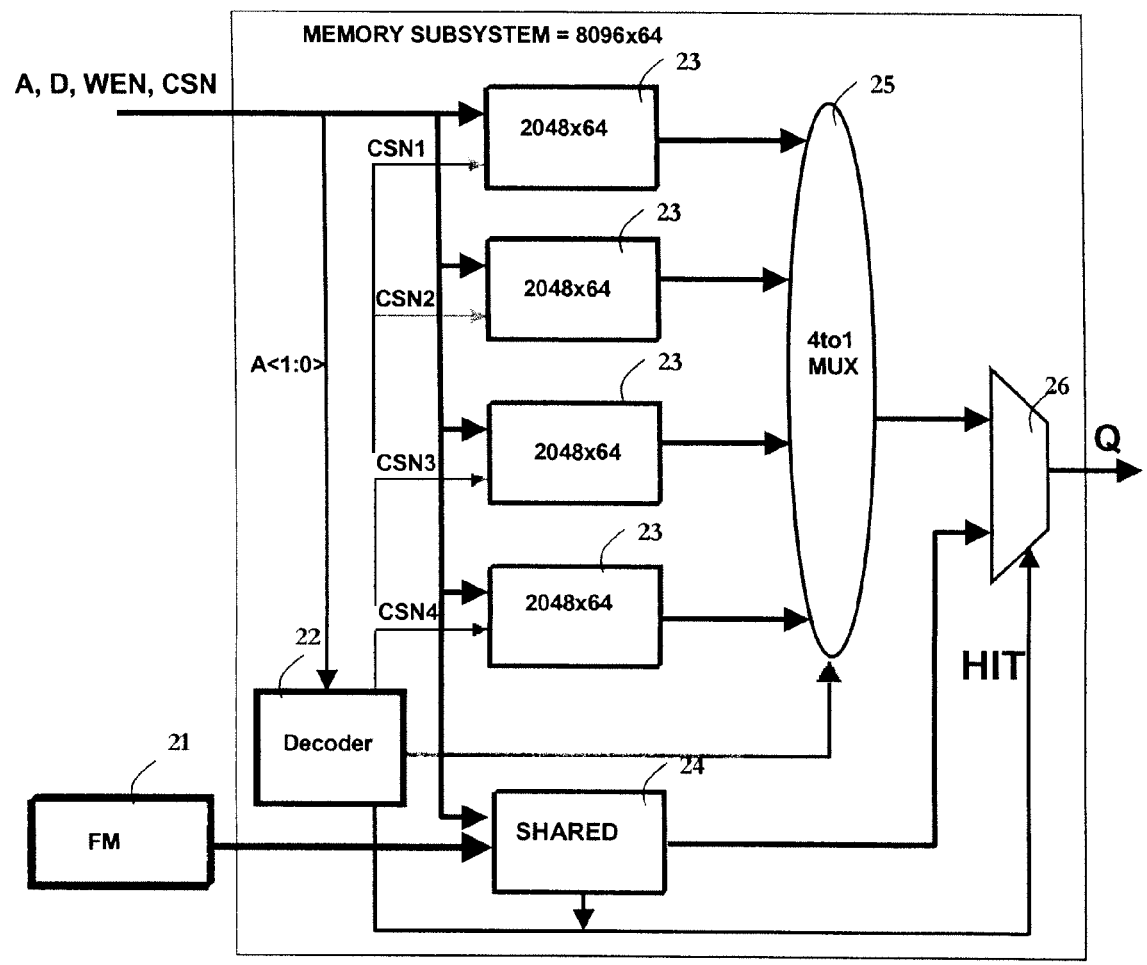
FIG. 2 illustrates type-1 memory system incorporating a shared redundant memory in accordance with the present invention.

FIG. 2 illustrates a type-1 memory system with a shared redundant memory 24 wherein N repairable memories 23 of size 2048×64 are combined to form a larger memory of size (N ×2048)×64 for an N=4 embodiment. The type-1 system in this embodiment comprises 4 repairable memories 23, a 4-to-1 memory selection multiplexer 25, 2-to-1 output selection multiplexer 26, a decoder 22, a fuse box 21 and a type-1 redundant memory 24. The system address CSN (in this case the same signals CSN1-4, in this case SA) is connected to the address port of all repairable memories 23 and output of each repairable memory 23 is connected to the 4-to-1 memory selection multiplexer 25. The $\log_2 N$ memory selection control inputs A (in this case 2, A<0:1>) and other inputs are connected to the decoder 22. The control output of the decoder 22 is connected at the control input of the 4-to-1 memory selection multiplexer 25, the decoded SA is coupled to the repairable and redundant memories. The address FA from the fuse box 21 is also connected to the redundant memory 24. Output of the redundant memory 24 and output of the 4-to-1 memory selection multiplexer 25 are connected to the 2-to-1 output selection multiplexer 26 and a control input HIT signal is coupled to the control node of the 2-to-1 output selection multiplexer 26. Output Q of the 2-to-1 output selection multiplexer 26 is used as the output of a memory location in type-1 memory system.

Hence, in the new architecture, a type-1 redundant memory 24 is added to the type-1 memory system as a shared redundancy instead of a redundant memory for each repairable memory 23. As this modification reduces the number of required redundant elements, the overall area of a SoC is reduced. In the modified system, the read operation on a memory requires addition of an output selection multiplexer 26 and a shared redundant memory 24. The memory address and memory selection control inputs A for a faulty location are first programmed in the fuse box and output from the fuse box is decoded by the decoder to generate a FA. FA along with SA are simultaneously fed to the redundant memory 24. The comparator in the redundant memory 24 then compares the two addresses, and if they match, a HIT signal is generated. A high HIT signal indicates that the controls on SoC have tried to perform an operation on a faulty memory location in one of the repairable memories 23. This HIT signal is used as a control input for multiplexers 14 for write operations on the redundant memory 24. An write enable signal from external pins is passed to the redundant memory along with the date for write operation by multiplexers 14 in the redundant memory on receiving a high HIT control signal. For read operation on modified memory system, SA is simultaneously used as an input for all repairable memories 23 and the data output each of the repairable memories is passed to the memory selection multiplexer 25. The memory selection multiplexer 25 is used to select the correct data output using the control input A from the decoder 22. The data output from the redundant memory 24 and the memory selection multiplexer 25 are fed to the 2-to-1 output selection multiplexer 26. Based on the HIT signal, one of the two inputs is selected as the output of the memory system. Hence, if there is a problem with a location in one of the repairable memories, a high HIT signal is generated and the operation is performed on a memory location in the redundant memory. The multiplexers 14, 25 and 26 at the output can be implemented as full custom or semi custom depending upon the need.

Figure 3:
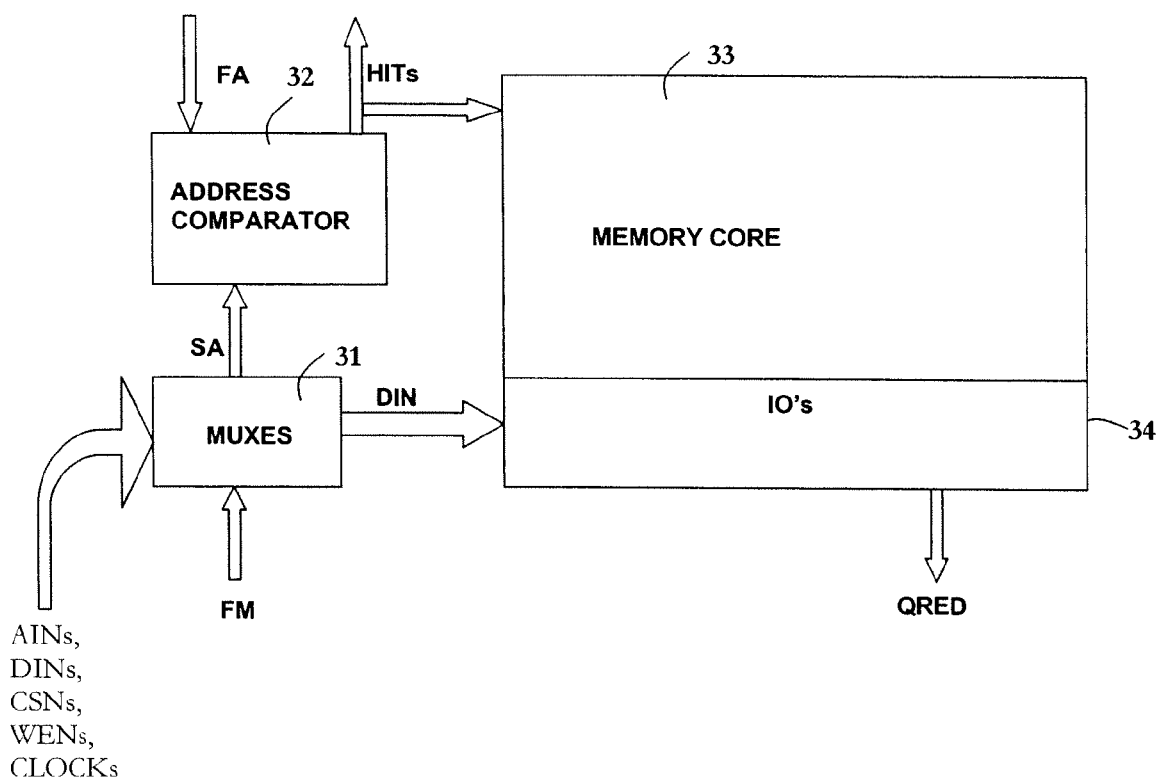
FIG. 3 illustrates the block diagram for the type-2 redundant memory in accordance with the present invention.

FIG. 3 illustrates the block diagram of the type-2 redundant memory. The redundant memory architecture comprises a comparator 32, a first set of multiplexers 31, an I/O Section with a second set of multiplexers 34 and a memory core 33. The first set of multiplexers 31 receive the data inputs DIN, memory selection inputs AIN, the input addresses CSN, write enable signals WENs and the system clocks for each of the repairable memories in type-2 system. The multiplexers 31 also receive the information regarding the faulty memory FM and the fault address information from the fuse box. The SA and DIN are decoded by the first set of multiplexers 31. SA is coupled to the comparator 32 and DIN is coupled to the I/O section 34. The comparator 32 generates a HIT signal which is connected to the memory core 33 for selecting a location within the shared memory for a read/write operation. The I/O section 34 is coupled to the memory core 33 and comprises a second set of multiplexers for write operation on the redundant memory.

Figure 4:
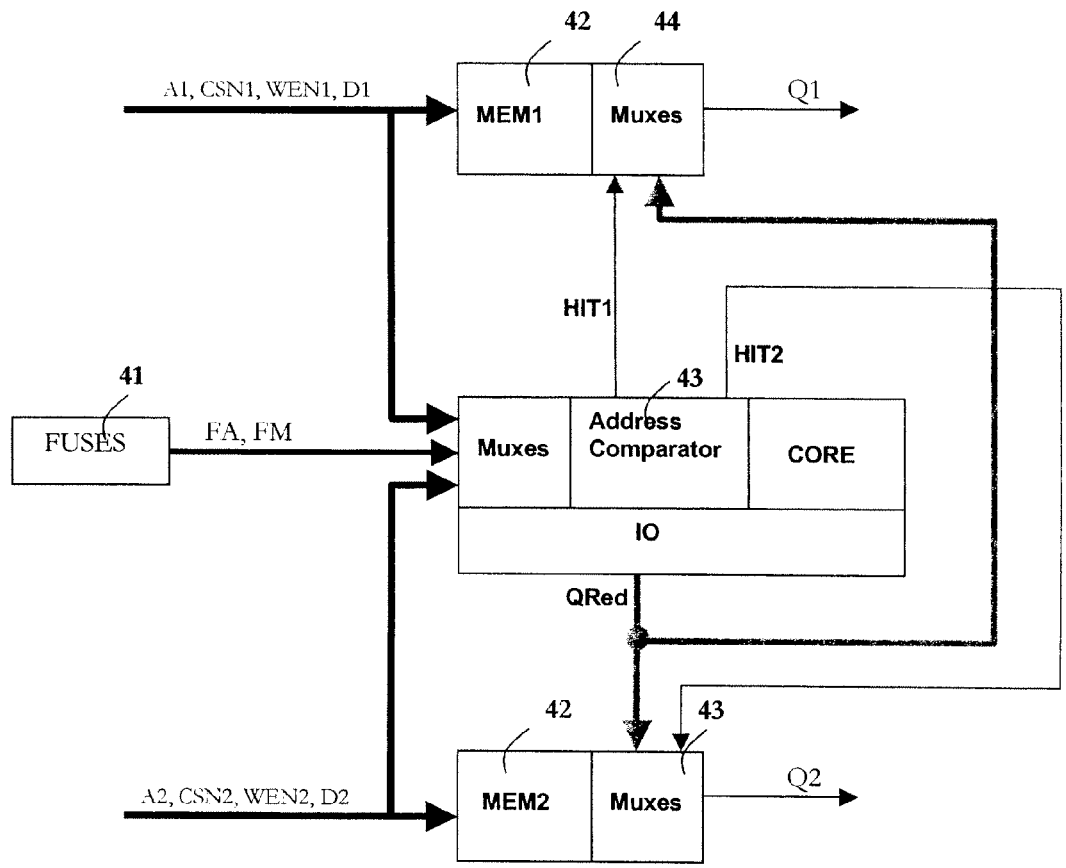
FIG. 4 illustrates type-2 memory system incorporating a shared redundant memory in accordance with the present invention.

FIG. 4 illustrates the modified type-2 memory system embodiment comprising two repairable memories 42 in close proximity and a type-2 redundant memory 43 shared by the two repairable memories 42. Besides these, the system also comprises a dedicated 2-to-1 output selection multiplexer 44 associated with each repairable memory 42. The redundant memory receives the inputs of the repairable memories 42(in this case, A1-2, CSN1-2, WEN1-2, D1-2) and the system clocks. The comparator is connected to each of the 2-to-1 output selection multiplexer 44 associated with two repairable memories 42. Besides the HIT signal, the 2-to-1 multiplexers 44 also receives the data output of the redundant memory 43 and the data output of associated repairable memory 42.

The working methodology in the system sharing type-2 redundant memories 43 is a bit different from the system sharing type-1 redundant memories 24. In this case, a input addresses and other inputs of all repairable memories 42 are fed to the shared redundant memory 43 simultaneously. At the same time, the inputs for each repairable memory 42 are fed to the respective repairable memory 42. In the redundant memory 42, the inputs are multiplexed with the decoded outputs generated through the fuse box 41. The fuse box 41 is programmed based on the FA in the repairable memories 42 and the select inputs are decoded. These select inputs decide which repairable memory inputs are used as the input to the redundant memory 43. The comparison of SA with FA, generation of the HIT signals and write operation on the type-2 redundant memory location happen in similar fashion as in the type-1 redundant memory. However, during a read operation, the data output from the redundant memory Qred is generated and fed to two 2-to-1 output selection multiplexers 44. If a faulty address is accessed in a repairable memory, for instance 42a, the input data of the repairable memory 42a is fed to the shared redundant memory 43 and the high HIT signal is generated for the associated output selection multiplexer 44a (in this case, HIT1). The connections (in this case, HIT2) to the associated output multiplexer is kept low as only one repairable memory 44a has access to the redundant memory 43 at a given time. If more than one faulty repairable memories 42 are accessed, the inputs for other faulty repairable memories are subsequently fed to the redundant memory 43 and HIT signal is generated for each accessed faulty location. These HIT signals (HIT1 or HIT2) are used as the control signal for selecting between the data output Qred of the redundant memory 43 and the associated repairable memories 42 Q using output selection multiplexers 44. As the redundant memory 43 is very small, the operating speed is very fast and hence, HIT signals can be generated for all accessed faulty locations before the read operation is completed on the repairable memories 42. Hence, during a read operation, if the repairable memory 44a is faulty, a high HIT signal is generated and the HIT signal is transmitted as the control input to the multiplexer 44a. As the timing penalty on the data output Q has to be reduced, the output selection multiplexers 44 are coupled to the memory 42. This solution may result in additional routing congestion as the Q buses may have to be routed to the original memory. This puts a limitation on the usage of this method. However, the routing congestion can be decreased by careful placement and floorplanning of the shared redundant memory 43.

To keep the system simple and to save area, all memories are non-self timed memories. The memory cells as well as the core, in the redundant memory are exactly matched with the repairable memory. To further reduce the area requirements, the I/O section in the redundant memory is made non-self timed and a simple inverter is used instead of a sense amplifier for sensing the correct data on the bitlines. Further, as there are only few rows on the bitlines the access time can always be kept faster than the main repairable memory module. Also as the address comparison does not come into the critical path of the main memory, there is no impact on the address setup time and the hold time of the memory.

Also, while the invention has been particularly shown and described with reference to the preferred embodiments thereof, it will be understood by those skilled in the art that various changes in form and details may be made without departing from the spirit and scope of the invention. A person skilled in the art will understand two embodiments described herein are for the purpose of sharing the redundant memories in type-1 and type-2 memory systems. The person skilled in the art may also understand that with minor modifications to instant invention, the sharing methodology may be used with different memory systems. For example, in one of the embodiments, a group of repairable memories may share more than one redundant memories by modifying the redundant memory. In another embodiment, a dedicated redundant memory may be used with a single physical large memory resulting in reduced hold and setup time for memory system with redundant elements.

While there have been described above the principles of the present invention in conjunction with specific components, circuitry and bias techniques, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

I claim:

1. A memory system comprising:
    at least one memory structure; each said memory structure receiving at least one input address and corresponding set of inputs for performing an operation on said memory structure;
    a fuse box for storing and transmitting faulty address information of said memory structures;
    at least one shared redundant memory; each of said shared redundant memory receiving said input addresses and said corresponding set of inputs for associated memories in a said memory structure and the faulty address information from the fuse box for repairing faulty locations in said associated memories; and
    at least one output selector; each said output selector for selecting between data output of said shared redundant memory and each data output of said associated memories responsive to a first control signal from said shared redundant memory.

2. A memory system, as claimed in claim 1, wherein said associated memories in a said memory structure are repairable memories.

3. A memory system, as claimed in claim 1, wherein each said memory structure receives a single input address and a corresponding set of inputs and generates a single data output.

4. A memory system, as claimed in claim 1, wherein each said memory structure comprises:
    a decoder logic block receiving a single input address and a first input of said memory structure for generating a second control signal and a system address;
    at least one repairable memory receiving said system address and a enable input of said memory structure for memory operations; and
    a memory output selector for selecting between the data outputs of said repairable memories responsive to said second control signal.

5. A memory system, as claimed in claim 1, wherein each said memory structure comprises at least one repairable memory; each said repairable memory receiving a separate input address and a separate corresponding set of inputs, and generating separate data output; each said separate data output is coupled to the data outputs of said memory structure.

6. A memory system, as claimed in claim 1, wherein each said shared redundant memory is connected to all output selectors coupled to said associated memories for transmitting said first control signal; said transmitting of said first control signal is responsive to said faulty address information.

7. A shared redundant memory architecture comprising:
    a comparator receiving a single input address and faulty address information for generating a first control signal for a memory system;
    a memory core receiving said first control signal for storing and retrieving data for faulty address locations in repairable memories;
    an Input/Output (I/O) block for bidirectional data transmission in said memory core; and
    a first input selector receiving a data input and said enable input of said memory structure for transmitting said data input to said I/O Block during write operation.

8. A shared redundant memory architecture, as claimed in claim 7, wherein each redundant memory comprises a second input selector for forwarding a single input address and a corresponding set of inputs from a plurality of input addresses and corresponding sets of inputs for a memory structure to said comparator; said second input selector is responsive to said faulty address information.

9. A redundant memory architecture comprising:
    a memory core;
    a set of multiplexers;
    an Input/Output (I/O) section; and
    a comparator,
    wherein the comparator receives a fault address and a system address, the comparator is coupled to the memory core, the data output of the memory core is coupled to the I/O section, and the set of multiplexers is coupled to the I/O section of a redundant memory to select a repairable memory input as input to the redundant memory during a write operation.

10. The redundant memory architecture of claim 9 further comprising an additional multiplexer to the redundant memory architecture to select between the outputs of the redundant memory and the repairable memory for a read operation.

11. The redundant memory architecture of claim 9 wherein the comparator receives the fault address from a fuse box.

12. The redundant memory architecture of claim 9 wherein the comparator receives the system address from external pins.

* * * * *